(12) United States Patent
Baier

(10) Patent No.: US 7,561,216 B2
(45) Date of Patent: Jul. 14, 2009

(54) OPERATING DEVICE FOR AN ELECTRICAL APPLIANCE AND ELECTRICAL APPLIANCE HAVING SUCH AN OPERATING DEVICE

(75) Inventor: Martin Baier, Ettlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 194 days.

(21) Appl. No.: 11/699,139

(22) Filed: Jan. 26, 2007

(65) Prior Publication Data

US 2007/0177065 A1    Aug. 2, 2007

(30) Foreign Application Priority Data

Jan. 30, 2006    (DE) .................. 10 2006 005 677

(51) Int. Cl.
*G02F 1/1335* (2006.01)
*G09F 9/00* (2006.01)

(52) U.S. Cl. ............... 349/12; 40/448; 362/561
(58) Field of Classification Search ............ 349/12; 40/448; 362/561
See application file for complete search history.

(56) References Cited

U.S. PATENT DOCUMENTS

| | | | |
|---|---|---|---|
| 4,731,503 A | 3/1988 | Kitanishi | |
| 5,869,791 A | 2/1999 | Young | |
| 5,893,623 A | 4/1999 | Muramatsu | |
| 6,411,352 B1* | 6/2002 | Kim | 349/58 |
| 6,771,327 B2* | 8/2004 | Sekiguchi | 349/12 |
| 6,897,390 B2 | 5/2005 | Caldwell et al. | |
| 2001/0020578 A1 | 9/2001 | Baier | |
| 2001/0033355 A1 | 10/2001 | Hagiwara | |
| 2003/0020844 A1* | 1/2003 | Albert et al. | 349/33 |
| 2003/0076451 A1* | 4/2003 | Hector et al. | 349/43 |
| 2003/0112403 A1 | 6/2003 | Ino | |
| 2005/0078027 A1 | 4/2005 | Philipp | |
| 2006/0038793 A1 | 2/2006 | Philipp | |
| 2006/0176266 A1* | 8/2006 | Pak et al. | 345/104 |
| 2006/0176436 A1* | 8/2006 | Deane | 349/149 |
| 2007/0068789 A1 | 3/2007 | Streifler | |

FOREIGN PATENT DOCUMENTS

| | | |
|---|---|---|
| DE | 29515421 | 10/1996 |
| DE | 10326684 A1 | 12/2004 |
| DE | 102004004022 A1 | 8/2005 |
| DE | 102004026672 A1 | 12/2005 |
| DE | 102004043415 A1 | 9/2006 |

OTHER PUBLICATIONS

Search Report for European Application No. EP07 00 0418.
German Search Report corresponding to International Application No. 10 2006 005 677.9 dated Jul. 26, 2006.

* cited by examiner

*Primary Examiner*—Frank G Font
*Assistant Examiner*—Jerry Blevins
(74) *Attorney, Agent, or Firm*—Alston & Bird LLP

(57) ABSTRACT

In an operating device for a cooktop with a liquid crystal display with two LCD plates, on the top of the lower of the two LCD plates is directly applied a microcontroller in the form of semiconductor chip, for example using COG technology. The semiconductor chip not only controls the LCD, but there are also provided capacitive sensor elements located on said LCD that are evaluated by the semiconductor chip, so that an independent module is formed. The module can be connected by suitable electrical connections to the cooktop and can at least partly or completely control the same.

17 Claims, 1 Drawing Sheet

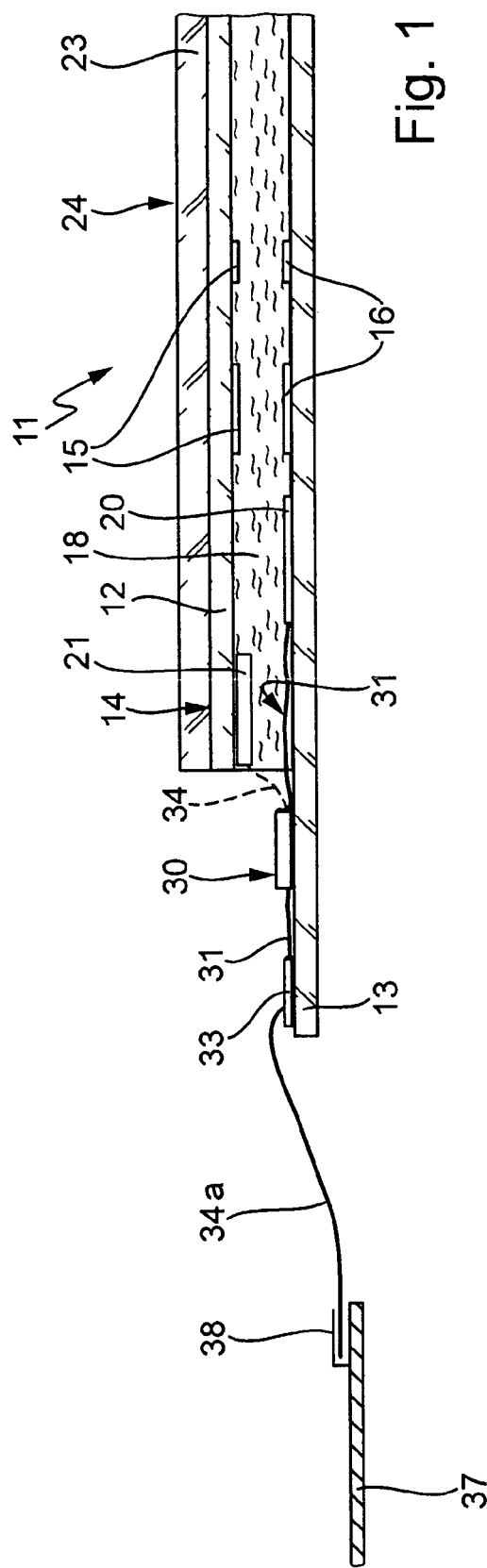
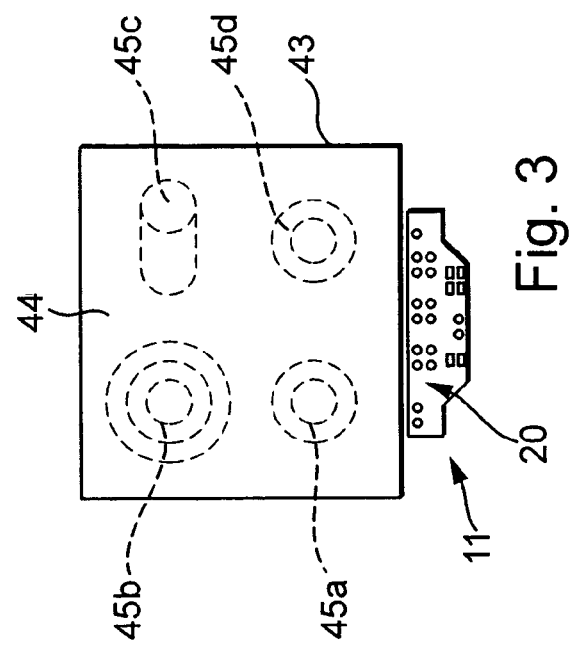
Fig. 3
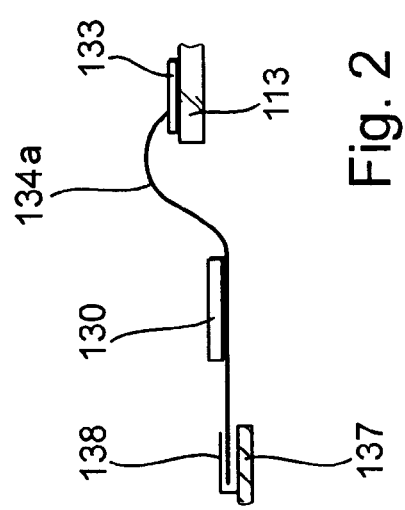
Fig. 2
Fig. 1

OPERATING DEVICE FOR AN ELECTRICAL APPLIANCE AND ELECTRICAL APPLIANCE HAVING SUCH AN OPERATING DEVICE

RELATED APPLICATIONS

The following disclosure is based on German Patent Application No. 102006005667.9 filed on Jan. 30, 2006, which is herewith incorporated into this application by explicit reference.

FIELD OF APPLICATION

The invention relates to an operating device for an electrical appliance and to an electrical appliance having such an operating device.

BACKGROUND OF THE INVENTION

From DE 100 11 645 A it is known to integrate so-called touch switches or their sensor elements into a LC display. This admittedly permits a certain integration of components or functions. However, for use in hobs or the like, it is ever more frequently desired to place displays and operating elements in a frame or in a frame area passing round the hob plate of a hob.

The problem addressed by the invention is to provide an operating device and an electrical appliance solving the prior art problems and avoiding the prior art disadvantages, whilst in particular making more flexible the arrangement of an operating device on an electrical appliance.

BRIEF DESCRIPTION OF THE DRAWINGS

The invention is described in greater detail hereinafter relative to embodiments and the attached drawings.

FIG. 1 discloses one embodiment of a section through a LC display or an operating device with sensor elements and a semiconductor chip fitted to the top of the lower plate.

FIG. 2 discloses another embodiment of fitting of the semiconductor chip to a foil conductor between the LC display and electrical appliance.

FIG. 3 discloses one embodiment of the LC display of FIG. 1 in front of a hob as the operating device and control for the same.

DETAILED DESCRIPTION OF EMBODIMENTS

In one embodiment, this problem is solved by an operating device according to claim 1 and an electrical appliance with such an operating device. Advantageous and preferred developments of the invention form the subject matter of further claims and are explained in greater detail hereinafter. By express reference the wording of the claims is made into part of the content of the description.

The liquid crystal ("LC") display has two parallel plates, which rest on one another, or have a limited mutual spacing, wherein individual segments or symbols can be represented or displayed in a conventional manner. The operating device also has contact switch sensor elements, such as are for example known in the form of capacitive sensor elements from DE 100 11 645 A. According to the invention on one side of a plate is provided, or attached an electronic circuit or semiconductor chip, so that the LC display and circuit form a module. Said electronic circuit or semiconductor chip is constructed for performing functions such as the controlling of the LC display and sensor elements and/or the evaluation of the sensor elements. Thus, according to the invention, it is possible to create a module of a LC display with sensor elements of a touch switch together with an electronic circuit or semiconductor chip, for example in the form of a microcontroller for control or evaluation purposes. By means of such an integration of functions and components, it is, for example, possible to make very short signal paths between sensor elements and the evaluation in order to reduce fault proneness. It is also possible to create an operating device with its own intelligence as an independent module. The circuit or semiconductor chip can be constructed for further tasks, as will be explained in greater detail hereinafter.

For placing or fixing the semiconductor chip on the LC display, it is possible according to a variant of the invention to apply it directly to one of the plates. It can either be bonded thereon or applied in a manner known from chip-on-glass technology.

According to another variant of the invention, the semiconductor chip can be applied to a thin, flexible support, for example a printed circuit board or foil. This support is in turn connected, for example bonded and electrically contacted with the LC display or one of the plates. This also makes it possible to provide the desired module. Through the application of the semiconductor chip to the support, it is possible in certain cases the technologically somewhat difficult fixing step to take place independently of the LC display. The support can be fixed to the LC display by bonding or adhesion. Preferably, the support is connected or bonded flat with one side of a plate of the LC display. Electrical conductors or the like can be present on the support and lead to contact banks on said support. This forms a possibility of connecting to a an electric contact means of the electrical appliance. If the semiconductor chip is applied directly to the LC display, then electric conductor-like conducting tracks or the like are advantageously also directly applied to the LC display.

Another possibility for the better utilization of the semiconductor chip is to construct it for controlling part of the overall electrical appliance, for example individual functional units, or even the entire appliance, for example in the form of a microcontroller. It is advantageously the only semiconductor chip, which reduces costs. It is possible for it to control functional units of the electrical appliance, particularly if they are determined or triggered by the operating device.

It is advantageous to apply the semiconductor chip to the top of the lower plate or non-outer plate when the operating device is in operation. It is thus possible to protect it and its mechanical fixing against damage.

It is advantageous if the aforementioned sensor elements are applied to the same surface as the circuit or semiconductor chip. Thus, more particularly with the aforementioned arrangement of the semiconductor chip on a support, which is in turn fixed to one of the plates, the sensor elements can also be located there. In particular these are capacitive sensor elements, which are advantageously flat. The expert is aware of several different sensor elements, for example from DE-A-10326684 and DE-A-102004043415, so that their implementation causes no problems.

Within the scope of the invention it is possible to construct an operating device as an independently handleable module in that as the electrical connection to the electrical appliance there are only connections or terminals for a supply voltage, such as an earth or ground connection and a connection for a serial bus. Said serial bus permits a various types of data transfer to the electrical appliance and for example a power part of the latter can be controlled by instructions inputted via the operating device.

According to a further development of the inventions the semiconductor chip is the only one for the entire electrical appliance, which also has no further sensor elements or operating elements, apart from in certain cases an on-off switch. This simplifies the construction of the electrical appliance. This also makes it possible to rapidly and easily replace a defective operating device. Finally, with a multiplicity of appliances and variants, it is possible to provide on similar basic appliances different functionalities by means of different operating devices, for example differently designed program variants.

Advantageously the operating device is made relatively thin, so that it can also be placed on a surface of the electrical appliance. For example in the case of a hob (cooktop) it can be in the marginal area, on the hob plate surface or laterally alongside or in front of a hob.

It is also possible to place the sensor elements on a further plate or further support instead of on the same plate, or in roughly the same plane as the semiconductor chip on the LC display. A connection with the semiconductor chip for control and/or evaluation purposes can take place by means of corresponding conductors, for example flexible conductors in the form of multiple flat cables or foil conductors. Said plate or said support with the sensor elements can be positioned above or on the top of the LC display. This is particularly advantageous if the sensor elements have to be located as close as possible to the contact or operating surface of the operating device. The sensor elements can also be located within or between the plates, such as is for example described in DE 100 11 645 A.

According to a further development back lighting of the LC display is possible, so that a display can be seen very well. It can also be in colour, so that the information display can take place in a comfortable and very varied form. Further LC display variants can be used.

These and further features can be gathered from the claims, description and drawings and the individual features can be implemented both singly or in the form of subcombinations in an embodiment of the invention and in other fields and can represent advantageous, independently embodiments for which protection is claimed here. The subdivision of the application into individual sections and the subheadings in no way restrict the general validity of the statements made thereunder.

FIG. 1 shows in section an operating device or LC display 11 having an upper plate 12 and a lower plate 13. In place of glass plates, it is also possible to use other transparent materials, for example plastic for the plates. For details reference should be made to the aforementioned DE 100 11 645 A1, the contents of which are incorporated by reference into the present description.

Between the plates 12 and 13 is provided an upper, conductor layer 15 and a lower, conductive layer 16 in individual, corresponding portions. Together with the liquid crystal 18 located between glass plates 12 and 13, they are used for displaying symbols or indicia, which is generally known.

For fitting the sensor elements of a touch switch, particularly capacitive sensor elements, several examples are given. Firstly a flat sensor element can be formed by a separate, controllable part of the functional layers 15 or 16, particularly as a capacitive sensor element or sensor element with capacitive coupling. Independently of the functional layers 15 and 16, further sensor elements 20 and 21 can be placed between glass plates 12 and 13, for example on the top of the lower plate 13 and on the bottom of the upper plate 12. Finally, it is also possible to provide a sensor element above the upper glass plate 12 and below a cover 23.

The cover 23 on LC display 11 can be a glass plate or the like and, as the transparent cover, covers not only an area of the LC display 11, but instead most or all of the same. Thus, cover 23 can in particular serve as a mechanical protection for the LC display, because normally the upper plate 12 is not constructed in as stable a manner as it should for everyday demands as an operating device with touch switches.

The transparent cover 23 can be a relatively stable glass plate with a thickness of a few or several millimetres, being for example made from very hard and/or very scratch-resistant glass. In certain circumstances it would also be possible to apply a further sensor element to the underside of the cover by a procedure as for the remaining sensor elements.

To the top of the lower plate 13 is applied a semiconductor chip 30. If the lower plate 13 is made from glass, it is possible to use for this purpose a chip-on-glass or COG procedure. This is per se known and is for example also described in DE 10 2004 004 022 A1, to which express reference is made here.

Along the top of the lower plate 13 conductive tracks 31 run from semiconductor chip 30, both to the left and to the right or in all directions. They are used for electrically connecting the semiconductor chip to other functional devices, as will be explained in greater detail hereinafter. For example, the conductive track 31 passing to the left runs to a left-hand contact bank 33, which is for example in the form of a metal coating on the top of the lower glass plate 13. By means of a flexible conductive 34a a connection passes to the lower, left-hand contact banks 38 on printed circuit board 37. Such a flexible conductor 34a is advantageously a foil conductor in the form of a foil provided with conductive tracks and in certain circumstances a corresponding multicore wire or cable. The printed circuit board 37 can be part of an electrical appliance, such as for example an electric heating appliance, which is operated with the operating device 11 or LC display and which displays thereon its information. Another possibility for connection to printed circuit board 37 or other devices of an electrical appliance is by means of not shown plugs or multiple plugs constituting an electrical connection.

By means of electrical connections 31, 33, 34 and 34a it is possible to connect the circuit 30 to printed circuit board 37 and semiconductor chip 30 or the electrical appliance, so that for the latter, it assumes the same functions as would otherwise have to be fulfilled by a specifically provided, further circuit or semiconductor chip for control purposes. Thus, it is possible for the semiconductor chip 30 to assume the full control of the electrical appliance and to provide on the latter only a circuit as a receiver for the serial bus, but not a complete controller.

The sensor element 20 is connected by means of a conductive track 31 to semiconductor chip 30, the conductive track or electrical connection 31 being passed out of the LC display or the space between the plates. The sensor elements 21 located on upper plate 13 are connected to semiconductor chip 30 for control and evaluation purposes by flexible conductors 34 shown in broken line form. There are numerous possibilities for the design of the contacting means and the choice thereof causes no problem to the expert.

Thus, FIG. 1 shows how an operating device 11 or LC display can be designed as an independent module together with the semiconductor chip 30, so-to-speak as the intelligence of the operating device. Advantageously the outgoing foil conductor 34a forms part of this. This independent module can already have the cover 23 or can be provided therewith. An electrical connection to the associated electrical appliance can be brought about by the various electrical contacting means using conductive tracks 31, flexible conductors 34, 34a and contact banks 33 for multiple plug contacts. Such an electrical connection can for example only provide connections for a supply voltage for the semiconductor chip 30, an earth or ground connection and connections for a serial bus. If the electrical appliance only has a power part for its electrical functional devices, its control advantageously takes place by means of said operating device 11 or semiconductor chip 30.

A further possible implementation of the invention is illustrated in the variant of FIG. 2. Here the semiconductor chip 130 is not directly on or fixed to the top of the lower plate 113 of the LC display. It is instead applied directly to a special foil conductor 134a, similar to foil conductor 34a in FIG. 1. It can be applied directly to foil conductor 134a or suitable intermediate layers can be provided. Fixing can take place using chip-on-foil or COF technology. Electrical contacting with the semiconductor chip 130 can take place by means of the conductive tracks already provided on foil conductor 134a. Foil conductor 134a runs between the contact banks 133 on plate 113 and contact banks 138 on printed circuit board 137. Thus, the signal lines between semiconductor chip 130 and the here not shown sensor elements also run on foil conductor 134a. This type of fitting the semiconductor 130 ensures that it forms a module with the sensor elements on the LC display.

There are obviously further possibilities for the display properties of the LC display. Thus, back lighting or illumination (which is not shown) can be provided, which takes place in conventional manner. Naturally the LC display can also be in colour, so as to be able to display more information and also appear optically more attractive.

LC display 11 or the operating device can simultaneously be a type of operating device with control device and integrated display which also has input or operating elements in the form of touch switches, as shown in FIG. 3. Through corresponding electrical connections such an operating device can easily be placed at a random location on an electrical appliance, for example on an operating panel or the like in front of hob 43. An electrical connection to the hob can once again take place by means of foil conductor 34a in accordance with FIG. 1, or the foil conductor 134a in accordance with FIG. 2. Advantageously the operating device 11 is then so near to the hob that the foil conductor 34a is not exposed, so that it is protected against damage. Other measures such as covers or the like can also prove sufficient. No particular significance is attached here to the location of the fitting of the semiconductor chip, i.e., according to FIGS. 1 or 2.

Operating device 11 is elongated for housing the necessary sensor elements 20. Hob 43 has a hob plate 44 and four hotplates 45a to 45d. Together with semiconductor chip 30 operating device 11 forms the entire control or intelligence of hob 43. This then only requires power modules or power relays in order to transform the signals for power generation of the semiconductor chip 30 for hotplates 45 into the power supply for the same. Thus, the hob 43 does not require a control or its own intelligence.

An alternative fitting possibility for operating device 11 is at the top and directly on hob 43, advantageously along the leading edge or along a lateral edge. Otherwise this corresponds to what was described in connection with FIG. 3.

The invention claimed is:

1. An operating device for an electrical appliance, with a liquid crystal display ("LC display") having two parallel, superimposed plates, said LC display being constructed for displaying individual segments or symbols, said operating device having touch switch sensor elements, wherein on one side of one of said plates a semiconductor chip is placed thereon and said semiconductor chip functions to control said LC display and evaluate data from said sensor elements, wherein said LC display and said semiconductor chip are constructed as a module, and wherein for electrical connection to said electrical to said electrical appliance, said operating device only has connections for a supply voltage, for ground and for a serial bus for control of a power part of said electrical appliance by said semiconductor chip.

2. The operating device according to claim 1, wherein said semiconductor chip is applied directly to said LC display or one of said plates of said LC display and together forming the module unit.

3. The operating device according to claim 2, wherein said semiconductor chip is applied directly to said LC display using chip-on-glass technology.

4. The operating device according to claim 1, wherein said semiconductor chip is applied to a thin, flexible support, said support being connected to said LC display or one of said plates of said LC display.

5. The operating device according to claim 4, wherein said support is thin and flexible, having conductive tracks printed on it.

6. The operating device according to claim 4, wherein said semiconductor chip is applied to said support using chip-on-foil technology.

7. The operating device according to claim 4, wherein said support is connected and bonded flat with one side of one of said plates of said LC display and on said support electrical conductors are provided leading to contacting means for connection to an electrical contacting means of said electrical appliance.

8. The operating device according to claim 1, wherein said semiconductor chip is also constructed for control of said electrical appliance as its sole control.

9. The operating device according to claim 1, wherein said semiconductor chip is applied to a top of one of said plates not on an outside or not reachable in an operating state.

10. The operating device according to claim 1, wherein said electrical appliance has a plurality of operating elements and said plurality of operating elements of said electrical appliance are provided on said operating device.

11. The operating device according to claim 1, wherein said operating device or said LC display is less than 3 mm thick.

12. The operating device according to claim 1, wherein a further plate is connected to said LC display, which is located above said LC display.

13. The operating device according to claim 1, wherein said sensor elements are located within said plates.

14. The operating device according to claim 1, wherein at least one said sensor element is located on top of said lower plate.

15. The operating device according to claim 1, wherein there is a back lighting of said LC display.

16. An electrical appliance comprising an operating device comprising a liquid crystal display ("LC display") having two parallel, superimposed plates, said LC display being constructed for displaying individual segments or symbols, said operating device having touch switch sensor elements, wherein on one side of one of said plates a semiconductor chip is placed thereon and said semiconductor chip functions to control said LC display and evaluate data from said sensor elements, wherein said LC display and said semiconductor chip are constructed as a module, said electrical appliance comprising a cooktop with a glass ceramic heating area and said operating device is located in an outer area or frame area of said cooktop and is fixed directly to a top of said glass ceramic heating area.

17. An electrical appliance comprising an operating device comprising a liquid crystal display ("LC display") having two parallel, superimposed plates, said LC display being constructed for displaying individual segments or symbols, said operating device having touch switch sensor elements, wherein on one side of one of said plates a semiconductor chip is placed thereon and said semiconductor chip functions to control said LC display and evaluate data from said sensor elements, wherein said LC display and said semiconductor chip are constructed as a module, said electrical appliance comprising a hob with a glass ceramic hob plate and said operating device is located next to said hob directly neighboring said glass ceramic hob plate.

* * * * *